United States Patent
Nakaya et al.

(10) Patent No.: US 6,423,964 B2
(45) Date of Patent: Jul. 23, 2002

(54) METHOD AND APPARATUS FOR ADJUSTING AMOUNT OF LIGHT IN IMAGE EXPOSURE RECORDING SYSTEM

(75) Inventors: Daisuke Nakaya, Kanagawa-ken; Akinori Hamana, Omiya; Katsuto Sumi, Minamiashigara, all of (JP)

(73) Assignees: Fuji Photo Film Co., Ltd., Kanagawa-ken; Fuji Photo Optical Co., Ltd., Saitama, both of (JP)

( * ) Notice: Subject to any disclaimer, the term of this patent is extended or adjusted under 35 U.S.C. 154(b) by 0 days.

(21) Appl. No.: 09/802,894

(22) Filed: Mar. 12, 2001

(30) Foreign Application Priority Data

Mar. 13, 2000 (JP) .......................................... 2000-069509

(51) Int. Cl.$^7$ ............................................. G01N 23/00
(52) U.S. Cl. ........................... 250/234; 250/205; 355/67
(58) Field of Search ................................. 250/234–236, 250/548, 559.46, 559.39, 559.41, 559.45, 205, 214 R, 208.1; 356/399–401, 356, 360, 237.1–237.5, 394, 239.1; 355/67–71, 77; 372/24–25

(56) References Cited

U.S. PATENT DOCUMENTS

| | | | | |
|---|---|---|---|---|
| 5,144,605 A | * | 9/1992 | Kobayashi et al. | 369/44.26 |
| 5,377,009 A | * | 12/1994 | Kitaoka et al. | 356/401 |
| 6,268,906 B1 | * | 7/2001 | Suzuki | 355/67 |
| 6,288,780 B1 | * | 9/2001 | Fairley et al. | 356/237.1 |

* cited by examiner

Primary Examiner—Kevin Pyo
Assistant Examiner—Seung C. Sohn
(74) Attorney, Agent, or Firm—Sughrue Mion, PLLC

(57) ABSTRACT

The amount of exposure to a light beam is coarsely adjusted by a coarse adjusting unit which has a wider adjustment range, and finely adjusted by a fine adjusting unit which has a narrower adjustment range but a higher adjustment accuracy. With the coarse and fine adjusting units, the amount of light of the light beam for recording an image can be adjusted to a nicety by a relatively inexpensive arrangement.

15 Claims, 9 Drawing Sheets

FIG. 9

| i | p(i) | adt(i, g) | nd(i) | aom(i) |
|---|---|---|---|---|
| i | p(i) | adt(i, g) | nd(i) | aom(i) |
| i | p(i) | adt(i, g) | nd(i) | aom(i) |
| i | p(i) | adt(i, g) | nd(i) | aom(i) |
| i | p(i) | adt(i, g) | nd(i) | aom(i) |
| i | p(i) | adt(i, g) | nd(i) | aom(i) |
| i | p(i) | adt(i, g) | nd(i) | aom(i) |
| i | p(i) | adt(i, g) | nd(i) | aom(i) |
| i | p(i) | adt(i, g) | nd(i) | aom(i) |
| i | p(i) | adt(i, g) | nd(i) | aom(i) |
| i | p(i) | adt(i, g) | nd(i) | aom(i) |
| i | p(i) | adt(i, g) | nd(i) | aom(i) |
| i | p(i) | adt(i, g) | nd(i) | aom(i) |
| i | p(i) | adt(i, g) | nd(i) | aom(i) |
| i | p(i) | adt(i, g) | nd(i) | aom(i) |

METHOD AND APPARATUS FOR ADJUSTING AMOUNT OF LIGHT IN IMAGE EXPOSURE RECORDING SYSTEM

BACKGROUND OF THE INVENTION

1. Field of the Invention

The present invention relates to a method of and an apparatus for adjusting an amount of light in an image exposure recording system which scans a recording medium with a light beam to record an image on the recording medium by exposure to the light beam.

2. Description of the Related Art

Heretofore, there have widely been used image exposure recording systems in which a light beam modulated by image information is deflected by a light deflector such as a galvanometer mirror or a resonant scanner, and applied to scan a recording medium such as a film that is being fed in one direction, in another direction substantially perpendicular to the direction in which the recording medium is fed, for thereby recording an image on the recording medium by exposure to the light beam.

The image recorded on the recording medium has its density depending on the amount of light of the light beam. Therefore, the amount of light of the light beam applied to the recording medium needs to be set highly accurately in order to obtain an image of desired density. When a laser beam whose amount of light has a Gaussian distribution is applied to record an image on a recording medium which produces a color upon being supplied with a light energy beyond a certain level, the amount of light of the laser beam needs to be set with high accuracy in order to achieve a desired coloring range.

It has been customary to adjust the amount of light of a light beam by inserting an optical filter such as an ND filter or the like which has its optical transmittance varying stepwise depending on the location on the optical filter, forming on a recording medium a test pattern which is area-modulated by varying the position of the optical filter, and measuring the density of the test pattern to determine an amount of light that can achieve an optimum exposure state.

The accuracy of the adjustment of the amount of light according to the above process greatly depends on the resolution of the optical filter. Therefore, a highly expensive optical filter is required if the amount of light is to be adjusted to a nicety. However, it is very difficult to manufacture an optical filter which has a high resolution and a wide adjustment range. In addition, an expensive measuring unit is necessary to measure the density of an area-modulated screen-tint test pattern.

SUMMARY OF THE INVENTION

It is a general object of the present invention to provide a method of and an apparatus for adjusting the amount of light of a light beam to record a desired image in an image exposure recording system, highly accurately with an inexpensive arrangement without the need for a special measuring unit.

A major object of the present invention is to provide a method of and an apparatus for adjusting the amount of a continuously oscillating light beam effectively and highly accurately in an image exposure recording system.

Another object of the present invention is to provide an inexpensive amount-of-light adjusting device having a means for modulating a light beam depending on an image to be recorded, doubling as a means for finely adjusting an amount of light, without increasing the number of components in an image exposure recording system.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 9 is a diagram showing a test pattern outputted to a recording medium.

DESCRIPTION OF THE PREFERRED EMBODIMENTS

Figure 1:
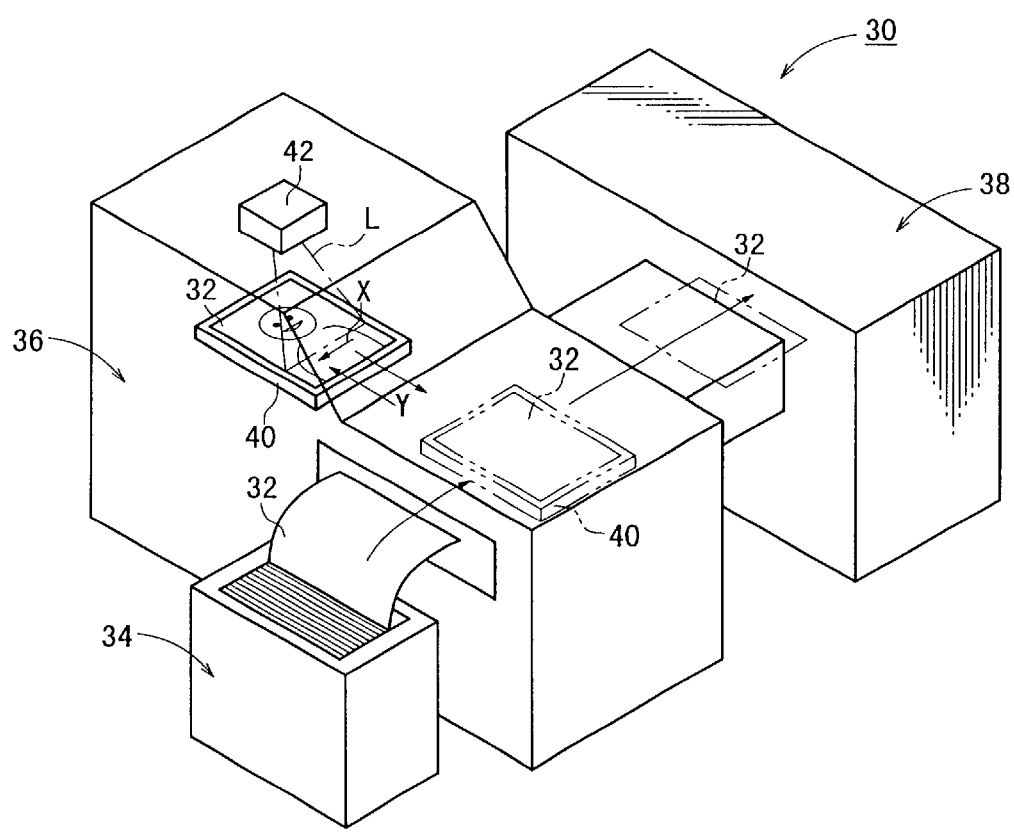
FIG. 1 is a perspective view of a printing plate producing system.

FIG. 1 shows in perspective a printing plate producing system 30 which incorporates a method of and an apparatus for adjusting an amount of light in an image exposure recording system according to the present invention.

As shown in FIG. 1, the printing plate producing system 30 directly produces a printing plate 32 on which image information for producing a printed material is recorded, from digital image data. The printing plate producing system 30 basically comprises a plate supplying device 34 for supplying an unexposed printing plate 32, a light beam scanning device 36 for scanning an unexposed printing plate 32 with a light beam modulated by image information to record an image on the printing plate 32, and a developing device 38 for developing the image recorded on the printing plate 32.

The plate supplying device 34 holds a plurality of unexposed printing plates 32 and supplies one at a time of the unexposed printing plates 32 to the light beam scanning device 36. The light beam scanning device 36 feeds the unexposed printing plate 32 by the exposure stage 40 supplied from the plate supplying device 34 in an auxiliary scanning direction indicated by the arrow Y, and at the same time scans the unexposed printing plate 32 with a laser beam L, which has been modulated by image information supplied from an image recording unit 42, in a main scanning direction indicated by the arrow X that is perpendicular to the auxiliary scanning direction, thereby recording a two-dimensional image on the printing plate 32. The developing device 38 develops the image recorded on the printing plate 32 that is supplied from the light beam scanning device 36.

Figure 2:
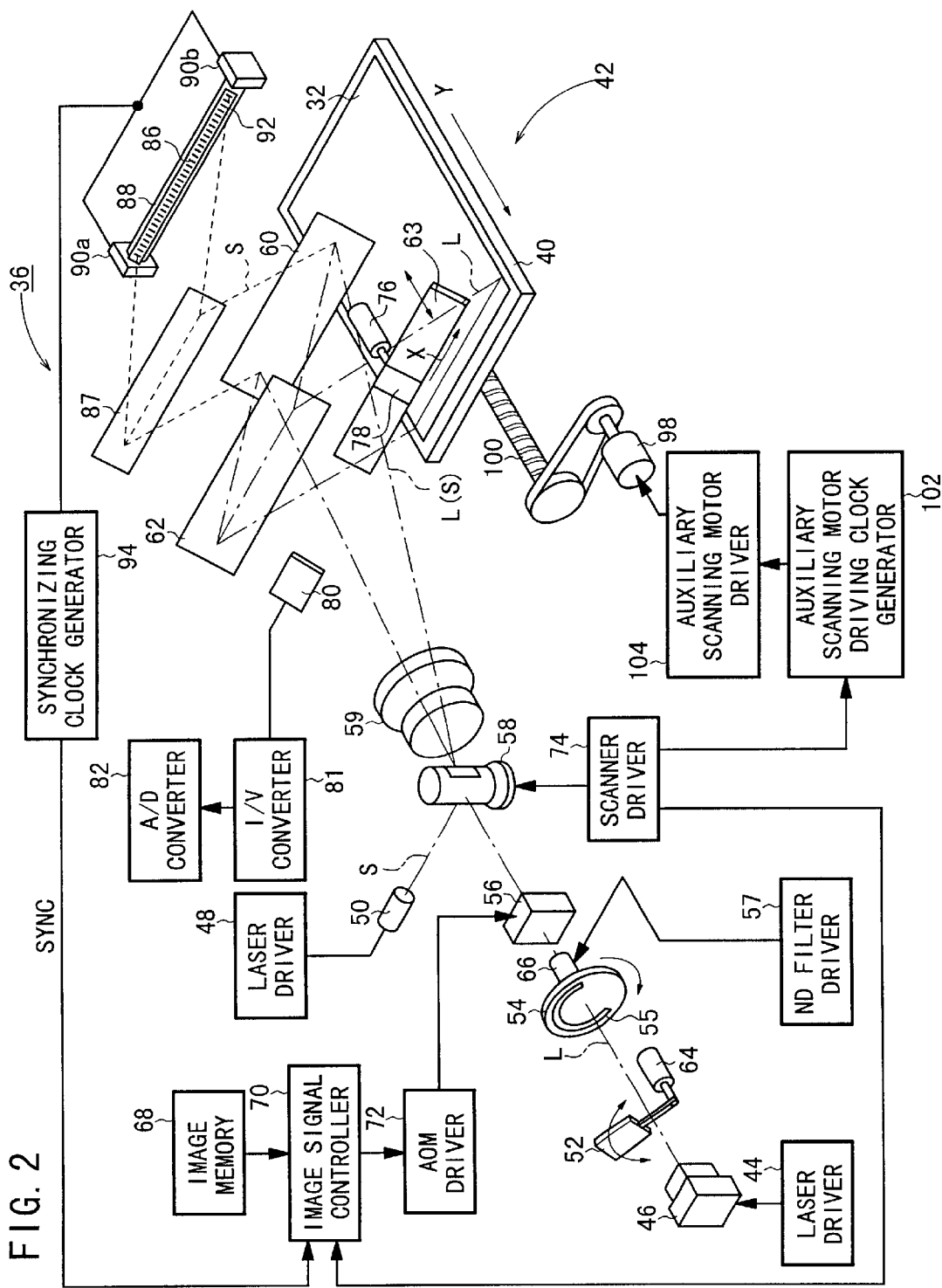
FIG. 2 is a schematic perspective view of a light beam scanning device, with a control circuit thereof shown in block form, in the printing plate producing system shown in FIG. 1.

FIG. 2 shows in perspective the light beam scanning device 36 together with its control circuit shown in block form.

As shown in FIG. 2, the light beam scanning device 36 has a recording light source 46 energizable by a laser driver 44 for outputting a continuously oscillating laser beam L for recording an image on a printing plate 32, and a synchronizing light source 50 energizable by a laser driver 48 for outputting a synchronizing laser beam S for generating a synchronizing clock signal used when the laser beam L scans the printing plate 32 in the main scanning direction.

The light beam scanning device 36 includes a mechanical shutter 52, a variable-transmittance ND filter 54 as a means for coarsely adjusting an amount of light, an acousto-optic modulator (AOM) 56 as a means for finely adjusting an amount of light or a modulating means, a resonant scanner 58, a scanning lens 59, reflecting mirrors 60, 62, and a mechanical shutter 63 which are successively disposed in the light path of the laser beam L that is outputted from the recording light source 46.

The mechanical shutter 52 is movable into and out of the light path of the laser beam L by a displacing unit 64 for selectively supplying and blocking the laser beam L to the printing plate 32.

Figure 3:
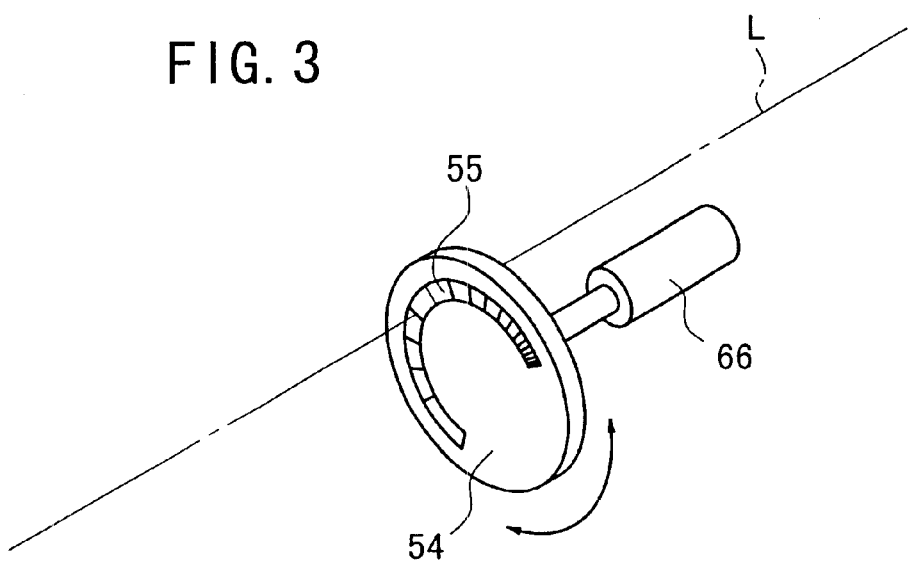
FIG. 3 is a perspective view of a variable-transmittance ND filter.

As shown in FIG. 3, the variable-transmittance ND filter 54 has an arcuate stepped edge 55 whose transmittance varies stepwise in an area thereof which transmits the laser beam L therethrough. The arcuate stepped edge 55 can be changed in position with respect to the light path of the laser beam L by an ND filter drive motor 66 that can be energized by an ND filter driver 57. The arcuate stepped edge 55 coarsely adjusts the amount of light of the laser beam L depending on its position with respect to the light path of the laser beam L.

Figure 4:
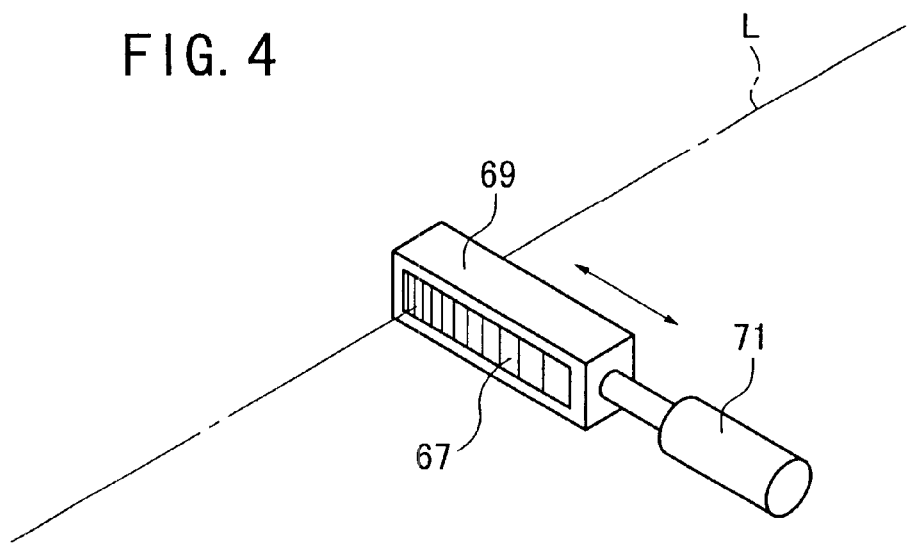
FIG. 4 is a perspective view of another variable-transmittance ND filter.

As shown in FIG. 4, the means for coarsely adjusting an amount of light may alternatively comprise a variable-transmittance ND filter 69 having a linear stepped edge 67 whose transmittance varies stepwise in an area thereof which transmits the laser beam L therethrough, the variable-transmittance ND filter 69 being movable by a displacing unit 71. If the laser beam L outputted from the recording light source 46 is a linearly polarized beam, then the means for coarsely adjusting an amount of light may comprise a rotatable polarizing filter for coarsely adjusting the amount of light of the laser beam L depending on its angular displacement.

The AOM 56 turns on and off the laser beam L depending on image information to be recorded, and finely adjusts the amount of light of the laser beam L that passes through the AOM 56 according to a controlled variable determined by an amount-of-light adjusting process to be described later on. The image information is read from an image memory 68, and converted into an on/off modulation signal by an image signal controller 70. The on/off modulation signal is supplied to an AOM driver 72. The AOM driver 72 supplies the AOM 56 with a drive signal whose intensity is finely adjusted by the controlled variable and which is turned on and off depending on the image information.

The means for finely adjusting an amount of light or modulating means may comprise, rather than the AOM 56, an electro-optic modulator (EOM) or a magneto-optic modulator (MOM). It is also possible to finely adjust the amount of light of the laser beam L by adjusting a drive signal supplied from the laser driver 44 to the recording light source 46, directly with a light source control circuit.

The resonant scanner 58 oscillates a mirror at a high speed with a drive signal supplied from a scanner driver 74, and deflects the laser beam L from the AOM 56 in the main scanning direction indicated by the arrow X and supplies the deflected laser beam L to the scanning lens 59. The laser beam L that has passed through the scanning lens 59 is adjusted in its scanning speed with respect to the main scanning direction, and is then reflected by the reflecting mirrors 60, 62 toward the printing plate 32.

The mechanical shutter 63 is positioned between the reflecting mirror 62 and the printing plate 32 and is elongate in the main scanning direction indicated by the arrow X. The mechanical shutter 63 is movable into and out of the light path of the laser beam L by a displacing unit 76. The mechanical shutter 63 has a reflecting mirror 78 disposed centrally therein. When the mechanical shutter 63 is in the light path of the laser beam L, the reflecting mirror 78 reflects the laser beam L toward a photodiode 80 for monitoring an amount of light. The photodiode 80, which serves as a means for detecting an amount of light, may be replaced with a phototransistor.

Figure 5:
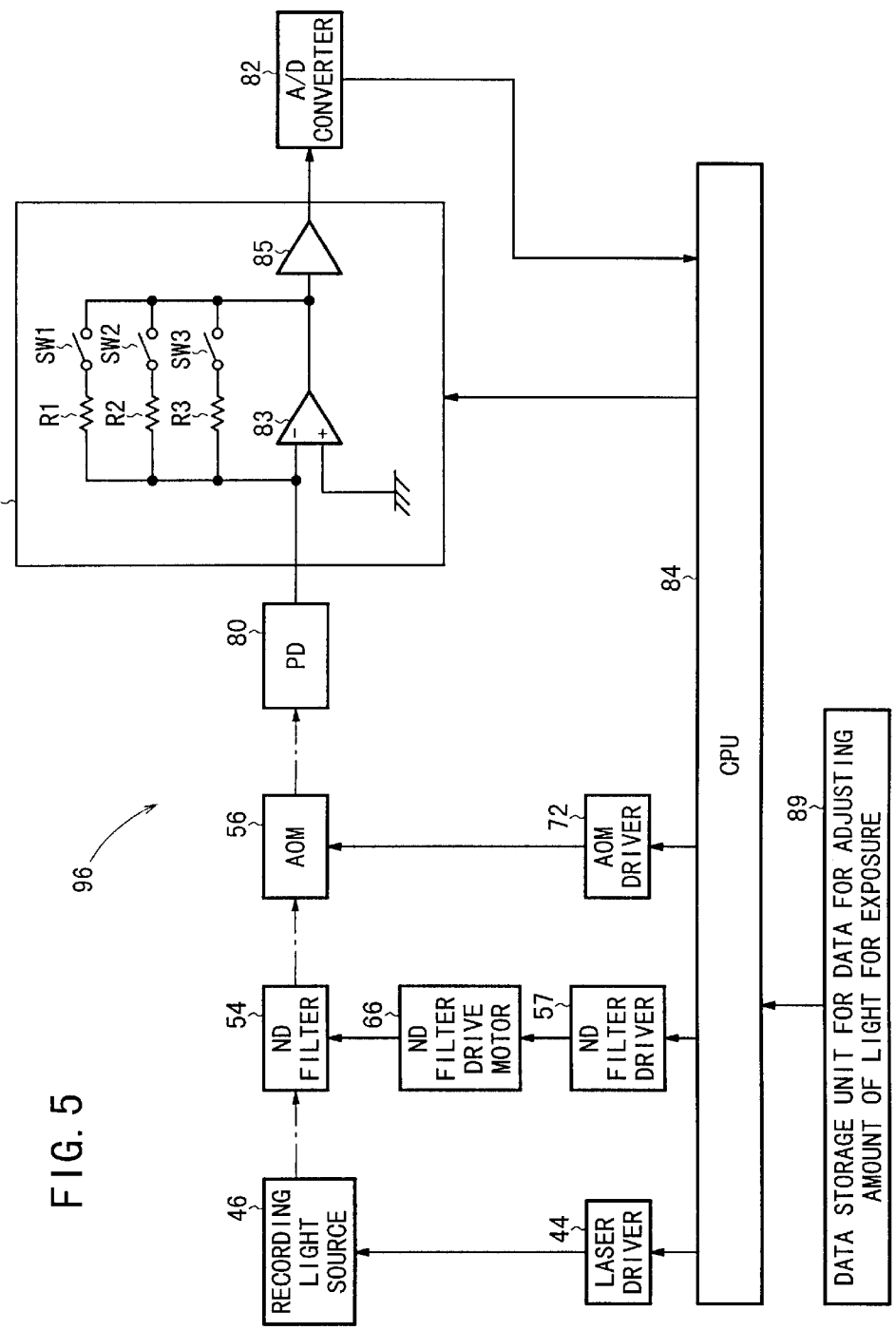
FIG. 5 is a block diagram of an amount-of-light adjusting circuit incorporated in the printing plate producing system shown in FIG. 1.

FIG. 5 shows in block form an amount-of-light adjusting circuit 96 for adjusting the amount of light of the laser beam L outputted from the recording light source 46. As shown in FIG. 5, the amount-of-light adjusting circuit 96 includes the variable-transmittance ND filter 54 (means for coarsely adjusting an amount of light), the AOM 56 (means for finely adjusting an amount of light), the photodiode 80 (means for detecting an amount of light), an I/V converter (gain control circuit) 81 for converting a current into a voltage, and an A/D converter 82 for converting an analog voltage signal from the I/V converter 81 into a digital voltage signal. The laser driver 44, the ND filter driver 57, the AOM driver 72, the I/V converter 81, and the A/D converter 82 are connected to a CPU 84 which serves as a means for calculating detected values of a target amount of light and a means for setting an adjustment quantity. To the CPU 84, there is connected a data storage unit 89 for storing various data for adjusting an amount of light for exposure. The data storage unit 89 serves as a first storage means and a second storage means.

The variable-transmittance ND filter 54, which serves as the means for coarsely adjusting an amount of light, may be replaced with an optical filter such as a polarizing filter. Further, the acousto-optic modulator (AOM) 56, which serves as the means for finely adjusting an amount of light, may be replaced with an optical filter such as an electro-optic modulator and a magneto-optic modulator. Alternatively, it is possible to adjust the amount of light directly by the laser driver 44.

The I/V converter 81 comprises a pair of series-connected front- and rear-stage amplifiers 83, 85, a plurality of resistors R1, R2, R3 connected parallel to and between input and output terminals of the front-stage amplifier 83, and a plurality of switches SW1, SW2, SW3 connected in series to the respective resistors R1, R2, R3. The switches SW1, SW2, SW3 can be controlled by the CPU 84 for controlling a gain, i.e., an amplification factor, of the I/V converter 81.

As shown in FIG. 2, the resonant scanner 58, the scanning lens 59, the reflecting mirror 60, a reflecting mirror 87, a reference grating 86, a light guide rod 88, and photodiodes 90a, 90b for generating a synchronizing signal are successively disposed in the light path of the synchronizing laser beam S that is outputted from the synchronizing light source 50.

The synchronizing light source 50 is positioned to apply the synchronizing laser beam S to the resonant scanner 58 at an angle different from the laser beam L. The synchronizing laser beam S is reflected and deflected in main scanning direction indicated by the arrow X by the resonant scanner 58. The synchronizing laser beam S deflected by the resonant scanner 58 travels through the scanning lens 59 to the reflecting mirror 60. The synchronizing laser beam S is reflected by the reflecting mirror 60 toward the reflecting mirror 87, which reflects the synchronizing laser beam S toward the reference grating 86. The synchronizing laser beam S passes through the reference grating 86.

The reference grating 86 is elongate in main scanning direction indicated by the arrow X, and has a linear succession of slits 92 along its longitudinal direction, the number of the slits depending on the resolution.

The light guide rod 88, which is substantially cylindrical in shape, is disposed behind the reference grating 86 to receive the synchronizing laser beam S that has passed through the reference grating 86. The light guide rod 88 is made of a material capable of transmitting light therethrough. The synchronizing laser beam S that has entered the light guide rod 88 is repeatedly reflected therein and travels therethrough to the photodiodes 90a, 90b which are disposed on the respective ends of the light guide rod 88.

To the photodiodes 90a, 90b, there is connected a synchronizing clock generator 94 for generating a synchronizing clock signal from the synchronizing laser beam S. The synchronizing clock signal generated by the synchronizing clock generator 94 is supplied, as a recording timing signal for the image information to be recorded with respect to the main scanning direction indicated by the arrow X, to the image signal control circuit 70.

The printing plate 32 is positioned on and held by an exposure stage 40, which can be fed in the auxiliary scanning direction indicated by the arrow Y by a ball screw 100 that is rotatable about its own axis by an auxiliary scanning motor 98. The auxiliary scanning motor 98 is energizable by an auxiliary scanning motor driver 104 based on a motor driving reference clock signal that is supplied from an auxiliary scanning motor driving clock generator 102. The motor driving reference clock signal is generated by the auxiliary scanning motor driving clock generator 102 based on a scanning clock signal which is a main scanning start timing signal supplied from the scanner driver 74.

The printing plate producing system 30 is basically constructed as described above. Operation of the printing plate producing system 30 will be described below.

First, an image recording process carried out by the printing plate producing system 30 will be described below with reference to FIGS. 1 and 2.

When the printing plate producing system 30 is turned on, the plate supplying device 34 supplies an unexposed printing plate 32 to the exposure stage 40 of the light beam scanning device 36. The exposure stage 40 which has been supplied with the unexposed printing plate 32 is displaced in the auxiliary scanning direction indicated by the arrow Y by the ball screw 100 that is rotated by the auxiliary scanning motor 98, thus feeding the printing plate 32 to a given position in the image recording unit 42.

In the light beam scanning device 36, the scanner driver 74 supplies a drive signal to the resonant scanner 58, whose mirror starts to oscillate at a high speed. At this time, the scanner driver 74 also generates a scanning clock pulse each time the mirror of the resonant scanner 58 oscillates in one main scanning cycle, and supplies the scanning clock pulse to the image signal controller 70.

Then, the laser driver 48 supplies a drive signal to the synchronizing light source 50, which outputs a synchronizing laser beam S. The synchronizing laser beam S outputted from the synchronizing light source 50 is reflected and deflected by the resonant scanner 58, and guided by the scanning lens 59 and the reflecting mirrors 60, 87 to the reference grating 86.

The synchronizing laser beam S applied to the reference grating 86 successively passes through the slits 92 as the synchronizing laser beam S moves along the reference grating 86 in the main scanning direction indicated by the arrow X, and enters as a pulsed light signal into the light guide rod 88. The pulsed synchronizing laser beam S is repeatedly reflected in the light guide rod 88 and travels therethrough to the photodiodes 90a, 90b on the respective ends of the light guide rod 88. The photodiodes 90a, 90b convert the pulsed synchronizing laser beam S into an electric signal and supplies the electric signal to the synchronizing clock generator 94. The synchronizing clock generator 94 shapes the waveform of the electric signal and multiplies its frequency thereby to generate a synchronizing clock signal. The synchronizing clock signal generated by the synchronizing clock generator 94 is supplied to the image signal control circuit 70.

Based on the scanning clock pulse from the scanner driver 74 and the synchronizing clock signal from the synchronizing clock generator 94, the image signal control circuit 70 converts image information read from the image memory 68 into an on/off modulation signal, which is supplied to the AOM driver 72. Based on the on/off modulation signal, the AOM driver 72 supplies a drive signal, which has been finely adjusted by a controlled variable determined by an amount-of-light adjusting process to be described later on, to the AOM 56.

The recording light source 46 energized by the laser driver 44 outputs a continuously oscillating laser beam L for recording an image. The laser beam L is guided to the AOM 56 via the variable-transmittance ND filter 54 which is angularly moved by the ND filter drive motor 66 to coarsely adjust the amount of light of the laser beam L. In this image recording mode, the mechanical shutter 52 that is positioned in front of the variable-transmittance ND filter 54 is retracted out of the light path of the laser beam L by the displacing unit 64.

Further, the mechanical shutter 63 positioned between the reflecting mirror 62 and the printing plate 32 is retracted out of the light path of the laser beam L by the displacing unit 76.

The laser beam L that is applied to the AOM 56 is turned on and off by the AOM 56 depending on the image information, and the amount of light of the laser beam L is finely adjusted by the AOM 56. The laser beam L is then supplied from the AOM 56 to the resonant scanner 58. The resonant scanner 58 reflects and deflects the laser beam L, which is guided by the scanning lens 59 and the reflecting mirrors 60, 62 to the printing plate 32.

The scanner driver 74 also supplies a scanning clock signal generated in each main scanning cycle to the auxiliary scanning motor driving clock generator 102. Based on the supplied scanning clock signal, the auxiliary scanning motor driving clock generator 102 generates and supplies a motor driving reference clock signal to the auxiliary scanning motor driver 104. Based on the supplied motor driving reference clock signal, the auxiliary scanning motor driver 104 generates a drive signal and applies the drive signal to energize the auxiliary scanning motor 98, which rotates the ball screw 100 about its own axis. The exposure stage 40 is now displaced in the auxiliary scanning direction indicated by the arrow Y in synchronism with the scanning clock signal.

Therefore, the laser beam L modulated with the image information is applied to the printing plate 32 in the main scanning direction indicated by the arrow X while the printing plate 32 is being fed in the auxiliary scanning direction indicated by the arrow Y, thereby forming a two-dimensional image on the printing plate 32.

The printing plate 32 with the two-dimensional image formed thereon is delivered to the developing device 38, which develops the image recorded on the printing plate 32. Thereafter, the printing plate 32 is fed to a printing process.

A process of adjusting the amount of light of the laser beam L in the printing plate producing system 30 will be described below with reference to FIGS. 6 and 7.

First, the displacing unit 76 is actuated to displace the mechanical shutter 63 to a closed position to allow the laser beam L outputted from the recording light source 46 to be reflected by the reflecting mirror 78 toward the photodiode 80 in step S1.

Then, the switch SW1 of the I/V converter 81 is turned on to set the amplification factor thereof to a minimum level, and an offset value ofs of the A/D converter 82 is measured in step S2. If no ambient light is applied to the photodiode 80 at this time, then the processing in step S1 may be dispensed with. The measured offset value ofs is stored in the data storage unit 89.

Figure 8:
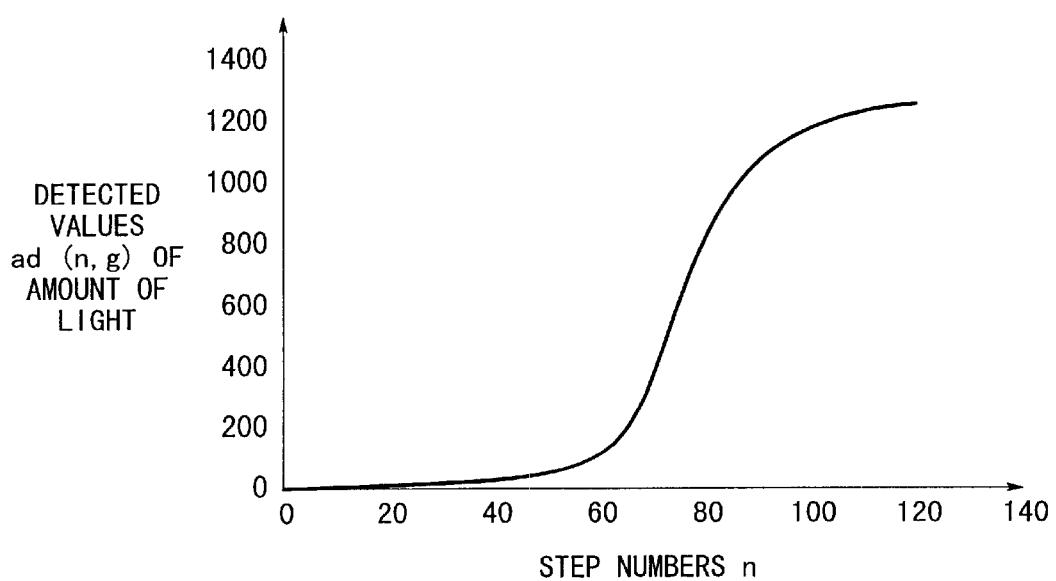
FIG. 8 is a diagram of amount-of-light control characteristic data for detected values of amounts of light with respect to step numbers of a variable-transmittance ND filter.

Then, amount-of-light control characteristic data of the variable-transmittance ND filter 54 is measured in step S3. Specifically, the recording light source 46 outputs a laser beam L having a constant amount of light, and the laser beam L is guided by the variable-transmittance ND filter 54, the AOM 56, the resonant scanner 58, the scanning lens 59, and the reflecting mirror 78 to the photodiode 80. The amount of light of the laser beam L is detected by the A/D converter 82. At this time, the ND filter drive motor 66 is energized to displace the stepped edge 55 of the variable-transmittance ND filter 54 stepwise, and amounts of light ad (n,g) at respective step numbers n of the stepped edge 55 are detected with respect to respective gains g (=1, 2, 3) of the I/V converter 81. The detected amounts of light ad (n,g) are stored as amount-of-light control characteristic data (see FIG. 8) in the data storage unit 89. The gains g represent a parameter for determining an amplification factor when the switches SW1, SW2, SW3 of the I/V converter 81 are successively turned on.

The CPU 84 calculates detected values adt (i,g) (i=1, 2, . . . ) of a target amount of light for respective set amounts of light p (i) for exposure in step S4. Specifically, if the reflecting mirror 78 has a reflectance r, the photodiode 80 has a sensitivity s, and the I/V converter 81 has a signal amplification factor m (g), then the detected value adt (i,g) of a target amount of light is calculated as follows:

$$adt(i,g)=p(i) \cdot r \cdot s \cdot m(g)+ofs \qquad (1)$$

where ofs is the offset value determined in step S2.

Figure 7:
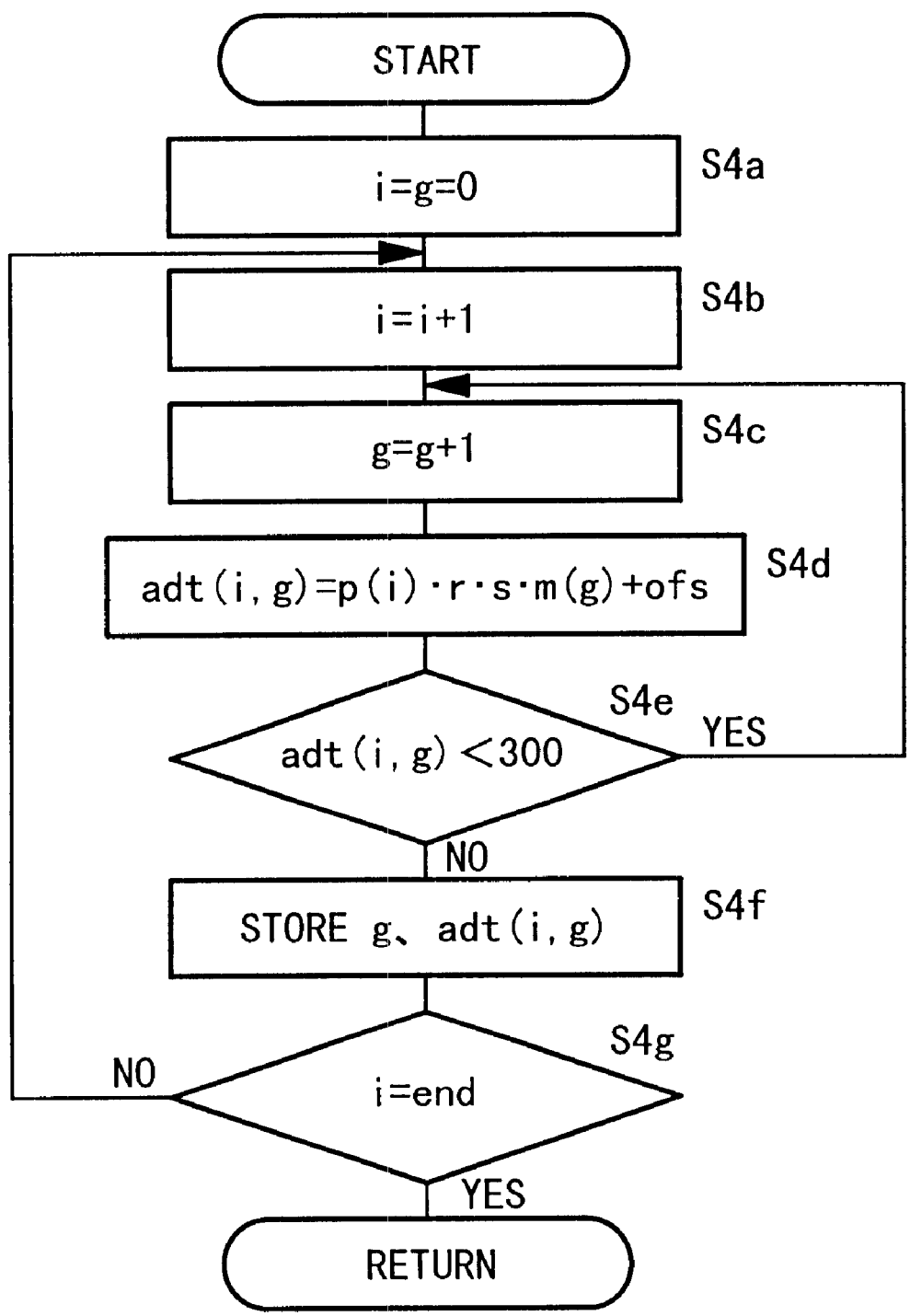
FIG. 7 is a flowchart of a subroutine of the processing sequence of the amount-of-light adjusting process shown in FIG. 6.

FIG. 7 shows a detailed process of calculating detected values adt (i,g) of a target amount of light in step S4.

First, i=g=1 in steps S4a, S4b, S4c, and a detected value adt (1,1) of a target amount of light is calculated in step S4d. If the calculated detected value adt (1,1) of a target amount of light is smaller than 300 in step S4e, then the gain g is set to g=2 to increase the amplification factor m (g) in step S4c. Then, a detected value adt (1,2) of a target amount of light is calculated again in step S4d. The loop is repeated until the calculated detected value adt (i,g) of a target amount of light becomes equal to or greater than 300, whereupon the detected value adt (i,g) of a target amount of light and the gain g are stored in the data storage unit 89 in step S4f.

The gain g is adjusted to make the detected value adt (i,g) of a target amount of light equal to or greater than 300 for the following reason: If the A/D converter 82 has a resolution of 12 bits, then the detected value adt (i,g) of a target amount of light is of a value in the range from 0 to 4095. By setting the detected value adt (i,g) of a target amount of light to a value in the range from 300 to 3000 for example, good linearity is obtained for increased detection accuracy.

The above process is carried out for each of the set amounts of light p (i) for exposure in step S4g. The set amounts of light p (i) for exposure may be spaced at intervals of $2^{1/3}$, i.e., may be 10 mW, $10 \cdot 2^{1/3}$ mW, $10 \cdot 2^{2/3}$ mW, . . . , for example.

Figure 6:
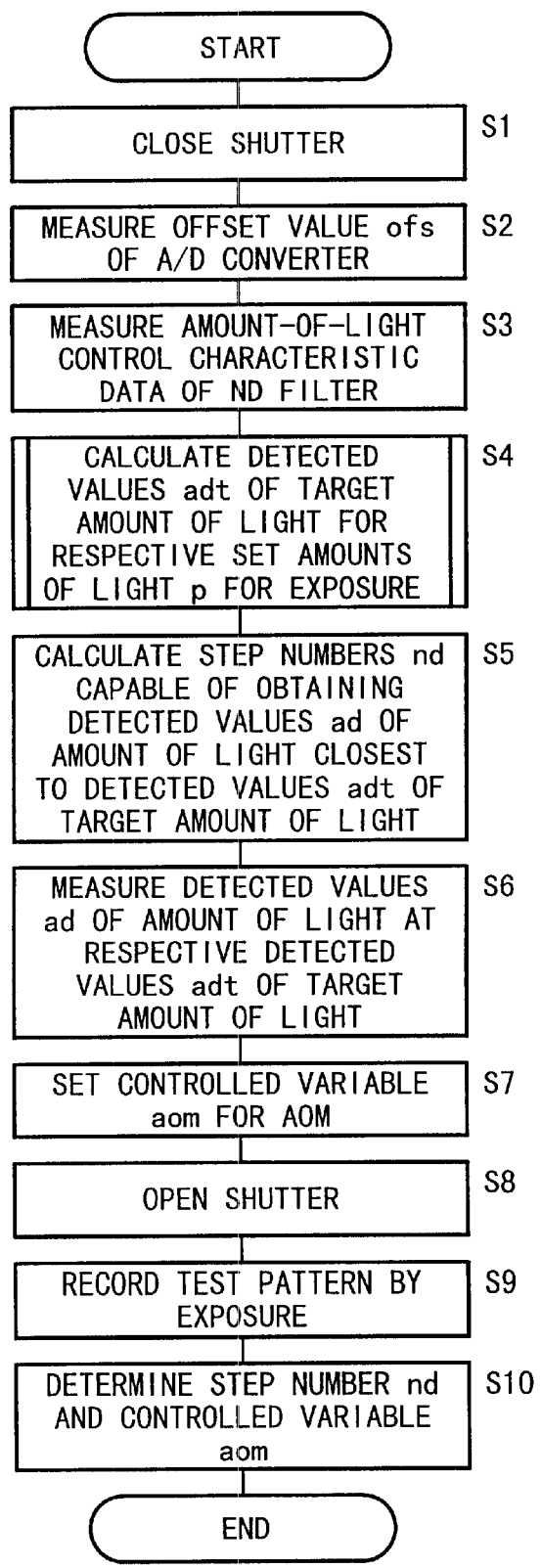
FIG. 6 is a flowchart of a processing sequence of an amount-of-light adjusting process.

Then, using the amount-of-light control characteristic data (see FIG. 8) determined in step S3, step numbers nd (i) of the variable-transmittance ND filter 54 capable of obtaining detected values ad (n,g) of an amount of light closet to the detected values adt (i,g) of a target amount of light are determined in step S5 (see FIG. 6).

Then, the ND filter driver 57 actuates the ND filter drive motor 66 to insert the stepped edge 55 at the respective step numbers nd (i) of the variable-transmittance ND filter 54 into the light path of the laser beam L, and the switches SW1, SW2, SW3 are set to equalize the gain g of the I/V converter 81 to the gains g of the detected values adt (i,g) of a target amount of light. Thereafter, the photodiode 80 measures detected values ad (nd (i), g) of an amount of light of the laser beam L at the respective settings in step S6.

Since the amount of light of the laser beam L has been coarsely adjusted by the variable-transmittance ND filter 54, the detected values ad (nd (i), g) of an amount of light obtained in step S6 are close to the detected values adt (i,g) of a target amount of light.

In order to equalize the detected values ad (nd (i), g) an amount of light to the detected values adt (i,g) of a target amount of light, the intensity of the drive signal supplied from the AOM driver 72 to the AOM 56 is adjusted to finely adjust the amount of light in step S7.

A controlled variable aom (i) for the drive signal of the AOM driver 72 adjusted to satisfy the equation:

$$ad(nd(i),g)=adt(i,g) \qquad (2)$$

is stored in the data storage unit 89.

After coarse adjustment quantities (step numbers nd (i)) and fine adjustment quantities (controlled variables (aom (i)) for the laser beam L with respect to the respective detected values adt (i,g) of a target amount of light have been determined, the displacing unit 76 is actuated to retract the mechanical shutter 63 to an open position out of the light path of the laser beam L in step S8, and a test pattern is recorded on the printing plate 32 by exposure to the laser beam L in step S9.

Specifically, the stepped edge 55 of the variable-transmittance ND filter 54 is set to a step number nd (i), and the drive signal supplied from the AOM driver 72 to the AOM 56 is set to a controlled variable aom (i). Then, the laser beam L is applied to the printing plate 32 for thereby producing a patch 91 at each of the set amounts of light p (i) for exposure, as shown in FIG. 9. Below each of the patches 91, there are simultaneously printed a patch number i, a set amount of light p (i) for exposure, a detected value adt (i,g) of a target amount of light, a step number nd (i), and a controlled variable aom (i).

The operator then visually observes the test pattern thus formed as shown in FIG. 9, selects a patch 91 that is considered to have an optimum density, and determines the step number nd (i) and the controlled variable aom (i)

relative to the selected patch 91 as a coarse adjustment quantity for the variable-transmittance ND filter 54 and a fine adjustment quantity for the AOM 56 in step S10. Alternatively, such a coarse adjustment quantity and a fine adjustment quantity can automatically be determined by the CPU 84 when the patch number i of the selected patch 91 is entered into the printing plate producing system 30.

According to another process of selecting a coarse adjustment quantity and a fine adjustment quantity, a patch 91 positioned at a boundary where a density starts to be applied is selected, and the step number nd (i) and the controlled variable aom (i) relative to a patch 91 with a density which is spaced from the selected patch 91 by a certain number of patches are determined as adjustment quantities. This process is effective to avoid a selection mistake and ensure more reliable adjustments.

Although certain preferred embodiments of the present invention have been shown and described in detail, it should be understood that various changes and modifications may be made therein without departing from the scope of the appended claims.

What is claimed is:

1. A method of adjusting an amount of light in an image exposure recording system which scans a recording medium with a light beam to record an image on the recording medium by exposure to the light beam, comprising the steps of:

(a) measuring the relationship between a plurality of coarse adjustment quantities for the light beam to be adjusted by means for coarsely adjusting an amount of light which is disposed in a light path of the light beam, and detected values of the amount of light of the light beam which has been coarsely adjusted;

(b) calculating a plurality of detected values of a target amount of light with respect to respective sets amounts of light for exposure;

(c) determining said coarse adjustment quantities capable of obtaining said detected values of the amount of light closest to the respective detected values of a target amount of light from the relationship which has been measured in said step (a);

(d) setting said means for coarsely adjusting an amount of light to the respective coarse adjustment quantities determined in said step (c), finely adjusting the amount of light with means for finely adjusting an amount of light which is disposed in a light path of the light beam, and determining fine adjustment quantities for said means for finely adjusting an amount of light to equalize the detected values of the amount of light of the light beam to the respective detected values of a target amount of light with respect to the set amounts of light for exposure;

(e) setting said means for coarsely adjusting an amount of light to the respective coarse adjustment quantities determined in said step (c), and setting said means for finely adjusting an amount of light to the respective fine adjustment quantities determined in step (d);

(f) applying said light beam to said recording medium at the respective set adjustment quantities to record respective test patterns on said recording medium by exposure to the light beam; and (g) select one of said test patterns recorded on said recording medium in a given recorded state, and setting said means for coarsely adjusting an amount of light and said means for finely adjusting an amount of light to the coarse adjustment quantity and the fine adjustment quantity relative to the selected one of the test patterns.

2. A method according to claim 1, wherein said light beam comprises a continuously oscillating laser beam.

3. An apparatus for adjusting an amount of light in an image exposure recording system which scans a recording medium with a light beam to record an image on the recording medium by exposure to the light beam, comprising:

means for coarsely adjusting an amount of light which is disposed in a light path of the light beam;

means for finely adjusting an amount of light which is disposed in the light path of the light beam;

means for detecting an amount of light of said light beam which is guided via said means for coarsely adjusting an amount of light and said means for finely adjusting an amount of light;

first storage means for storing the detected amount of light of said light beam with respect to a coarse adjustment quantity for the light beam to be adjusted by said means for coarsely adjusting an amount of light;

calculating means for calculating a plurality of detected values of a target amount of light with respect to respective sets amounts of light for exposure;

adjustment quantity setting means for setting coarse adjustment quantities for said means for coarsely adjusting an amount of light and fine adjustment quantities for said means for finely adjusting an amount of light to equalize the detected amount of light to each of the detected values of a target amount of light;

second storage means for storing the coarse adjustment quantities and the fine adjustment quantities which have been set by said adjustment quantity setting means; and control means for adjusting said means for coarsely adjusting an amount of light and said means for finely adjusting an amount of light according to the coarse adjustment quantities and the fine adjustment quantities stored in said second storage means, applying said light beam to said recording medium to record a plurality of test patterns on said recording medium by exposure to the light beam, and determining the coarse adjustment quantity and the fine adjustment quantity based on one of said test patterns in a given recorded state.

4. An apparatus according to claim 3, wherein said light beam comprises a continuously oscillating laser beam.

5. An apparatus according to claim 3, wherein said means for coarsely adjusting an amount of light or said means for finely adjusting an amount of light comprises an optical filter for adjusting the amount of light of said light beam.

6. An apparatus according to claim 5, wherein said optical filter as said means for coarsely adjusting an amount of light comprises an ND filter.

7. An apparatus according to claim 5, wherein said optical filter as said means for coarsely adjusting an amount of light comprises a polarizing filter.

8. An apparatus according to claim 5, wherein said optical filter as said means for finely adjusting an amount of light comprises an acousto-optic modulator.

9. An apparatus according to claim 5, wherein said optical filter as said means for finely adjusting an amount of light comprises an electro-optic modulator.

10. An apparatus according to claim 5, wherein said optical filter as said means for finely adjusting an amount of light comprises a magneto-optic modulator.

11. An apparatus according to claim 3, wherein said means for finely adjusting an amount of light comprises a light source controller for adjusting the amount of light of said light beam.

12. An apparatus according to claim 3, wherein said means for finely adjusting an amount of light comprises modulating means for modulating the light beam with the image to be recorded on the recording medium.

13. An apparatus according to claim 3, wherein said means for detecting an amount of light comprises a photodiode.

14. An apparatus according to claim 3, wherein said means for detecting an amount of light comprises a phototransistor.

15. An apparatus according to claim 3, wherein said means for detecting an amount of light has a gain control circuit.

* * * * *